(12) United States Patent
Schwab et al.

(10) Patent No.: US 12,347,805 B2
(45) Date of Patent: Jul. 1, 2025

(54) INKJET PRINTING OF DIFFUSION SOLDER

(71) Applicant: Infineon Technologies Austria AG, Villach (AT)

(72) Inventors: Stefan Schwab, Singapore (SG); Alexander Heinrich, Bad Abbach (DE); Catharina Wille, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 79 days.

(21) Appl. No.: 18/196,203

(22) Filed: May 11, 2023

(65) Prior Publication Data

US 2024/0379615 A1 Nov. 14, 2024

(51) Int. Cl.
*H01L 23/00* (2006.01)

(52) U.S. Cl.
CPC .... *H01L 24/84* (2013.01); *H01L 2224/84359* (2013.01); *H01L 2224/84825* (2013.01)

(58) Field of Classification Search
CPC . H01L 2224/84359; H01L 2224/84825; H01L 24/27; H01L 2224/03318; H01L 2224/0332; H01L 2224/838; H01L 2224/83801; H01L 2224/8382; B41J 2202/04
See application file for complete search history.

(56) References Cited

U.S. PATENT DOCUMENTS

| | | |
|---|---|---|
| 2006/0246695 A1 | 11/2006 | Kim et al. |
| 2014/0042603 A1 | 2/2014 | Hosseini et al. |
| 2016/0082718 A1 | 3/2016 | Schwab et al. |
| 2018/0240741 A1 | 8/2018 | Cook et al. |
| 2021/0143120 A1 | 5/2021 | Heinrich et al. |
| 2022/0046792 A1 | 2/2022 | Heinrich et al. |
| 2022/0059439 A1 | 2/2022 | Neidorff et al. |
| 2022/0084981 A1 | 3/2022 | Verdugo et al. |

FOREIGN PATENT DOCUMENTS

WO 2018112247 A1 6/2018

OTHER PUBLICATIONS

Thakur, Neha, et al., "Nickel-Based Inks for Inkjet Printing: A Review on Latest Trends", http://article.sapub.org/10.5923.j.materials.20211101.03.html, Jun. 15, 2021, 20-35.

Zyga, Lisa, "Ink with tin nanoparticles could print future circuit boards", https://phys.org/news/2011-04-ink-tin-nanoparticles-future-circuit.html, Apr. 12, 2011, 1-4.

*Primary Examiner* — Tucker J Wright
(74) *Attorney, Agent, or Firm* — Murphy, Bilak & Homiller, PLLC

(57) ABSTRACT

A method of producing a semiconductor device includes providing a semiconductor die, providing a metal joining partner, forming a diffusion solderable region by an inkjet metal printing process, forming an assembly to include the diffusion solderable region in between the metal joining partner and the semiconductor die, and performing a diffusion soldering process that forms a soldered joint from the diffusion solderable region in between the semiconductor die and the metal joining partner.

5 Claims, 6 Drawing Sheets

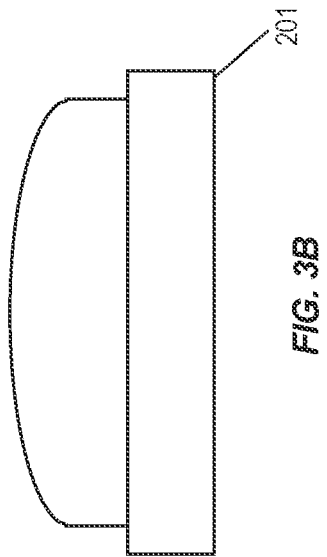
FIG. 3B
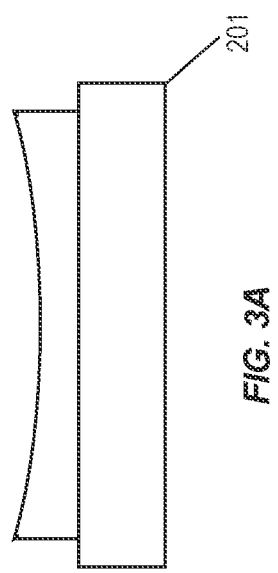
FIG. 3A
FIGURE 3

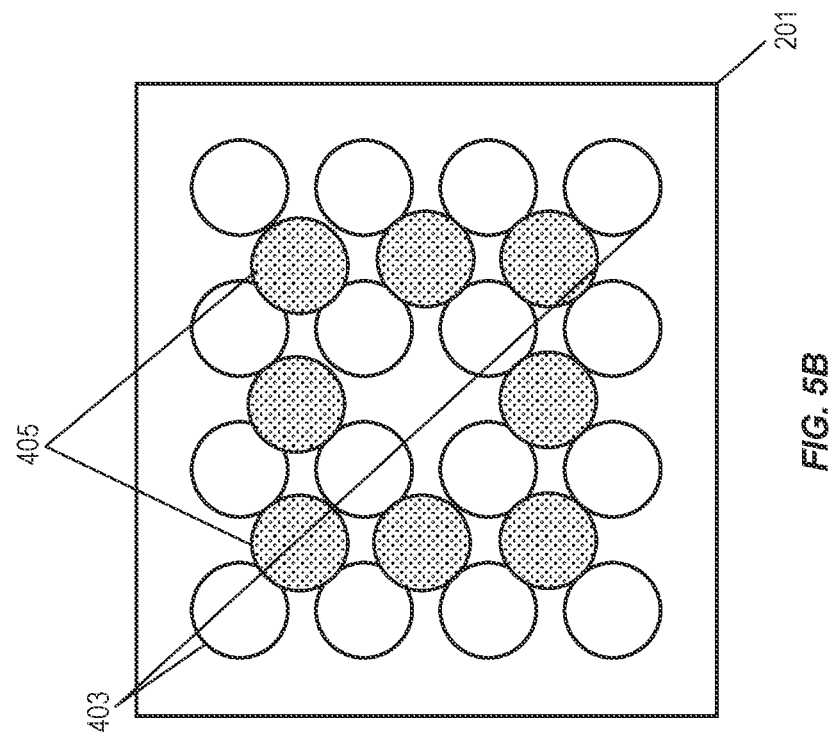
FIG. 5B
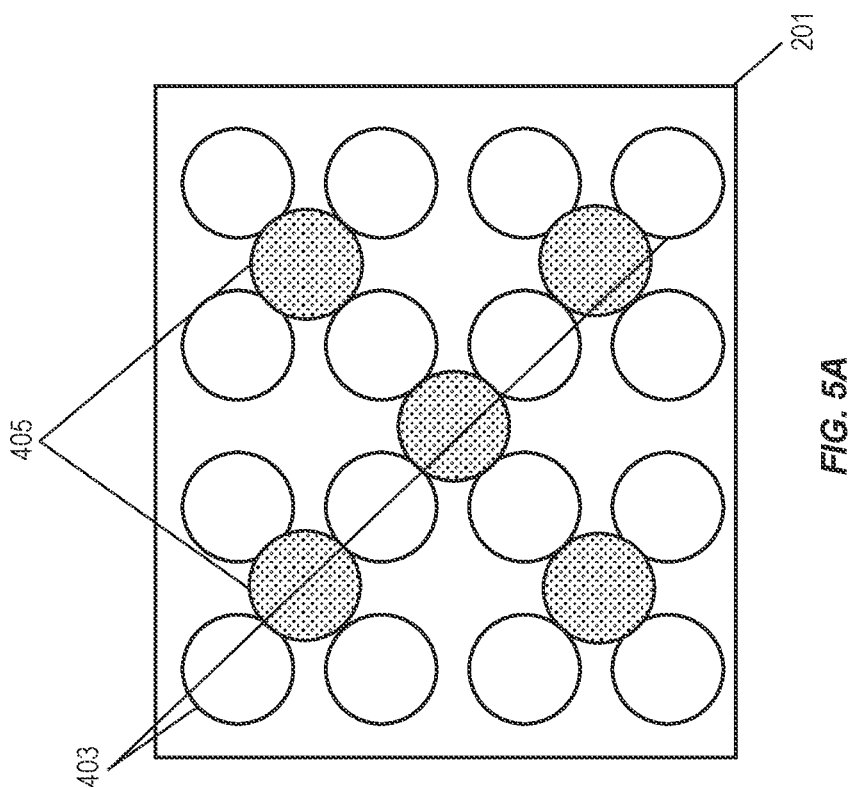
FIG. 5A
FIGURE 5

INKJET PRINTING OF DIFFUSION SOLDER

BACKGROUND

Thermal and electrical performance play an increasing role in the advancement of semiconductor technologies. These factors, coupled with miniaturization and increased performance, require high performance die (chip) attach processes and materials. Diffusion soldering is one such die attach process. Diffusion soldering involves on the formation of a soldered joint by diffusing different metals to form intermetallic phases. These intermetallic phases have a higher melting point than the adjacent material and are primarily responsible for the mechanical strength of the soldered joint. Proper execution of a diffusion soldering process requires careful calibration of the composition and geometric properties of the pre-solder material that is used to form the soldered joint. Current techniques for diffusion soldering use specialized equipment that is expensive and not well suited to form precise geometries and/or ultrathin layers that may be necessary in some cases. Thus, there is a need for an improved diffusion soldering technique.

SUMMARY

Those skilled in the art will recognize additional features and advantages upon reading the following detailed description, and upon viewing the accompanying drawings.

A method of producing a semiconductor device is disclosed. According to an embodiment, the method comprises providing a semiconductor die, providing a metal joining partner, forming a diffusion solderable region by an inkjet metal printing process, forming an assembly to comprise the diffusion solderable region in between the metal joining partner and the semiconductor die, and performing a diffusion soldering process that forms a soldered joint from the diffusion solderable region in between the semiconductor die and the metal joining partner.

According to another embodiment, the method comprises providing a semiconductor die, providing a metal die attach structure, providing a first metal interconnect element, forming a first diffusion solderable region and a second diffusion solderable region, forming an assembly to comprise the first diffusion solderable region in between the metal die attach structure and the semiconductor die and to comprise the second diffusion solderable region in between the semiconductor die and the first metal interconnect element, performing a diffusion soldering process that forms a first soldered joint from the first diffusion solderable region in between the semiconductor die and the metal joining partner and a second soldered joint from the second diffusion solderable region in between the semiconductor die and the first metal interconnect element, wherein at least one of the first diffusion solderable region and the second diffusion solderable region is formed by an inkjet metal printing process.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 3, which includes FIGS. 3A and 3B, illustrates embodiments of a diffusion solderable region that may be formed by an inkjet metal printing process, according to an embodiment.

FIG. 5, which includes FIGS. 5A and 5B, illustrates embodiments of droplet patterns that may be formed by an inkjet metal printing process, according to an embodiment.

DETAILED DESCRIPTION

Embodiments of a method of producing a semiconductor device that comprises forming a diffusion solderable region by an inkjet metal printing process are described herein. The inkjet metal printing process offers numerous advantages with respect to the application of the solder material. For example, inkjet metal printing may be performed at lower cost than other types of diffusion solder application techniques. Moreover, inkjet metal printing offers a great degree of flexibility in comparison to other techniques. In particular, the composition of the solder material can easily be varied, either as between two soldered joints or between sub-regions of the same soldered joint. Moreover, inkjet metal printing allows for the formation of diffusion solderable region with higher resolution and/or smaller area and/or closer spacing than other techniques. This allows for diffusion soldering to be used in locations that are not necessarily possible by other techniques, such as solder connections between die bond pads and metal interconnect elements. Moreover, inkjet metal printing may be easily integrated into existing assembly lines.

Figure 1:
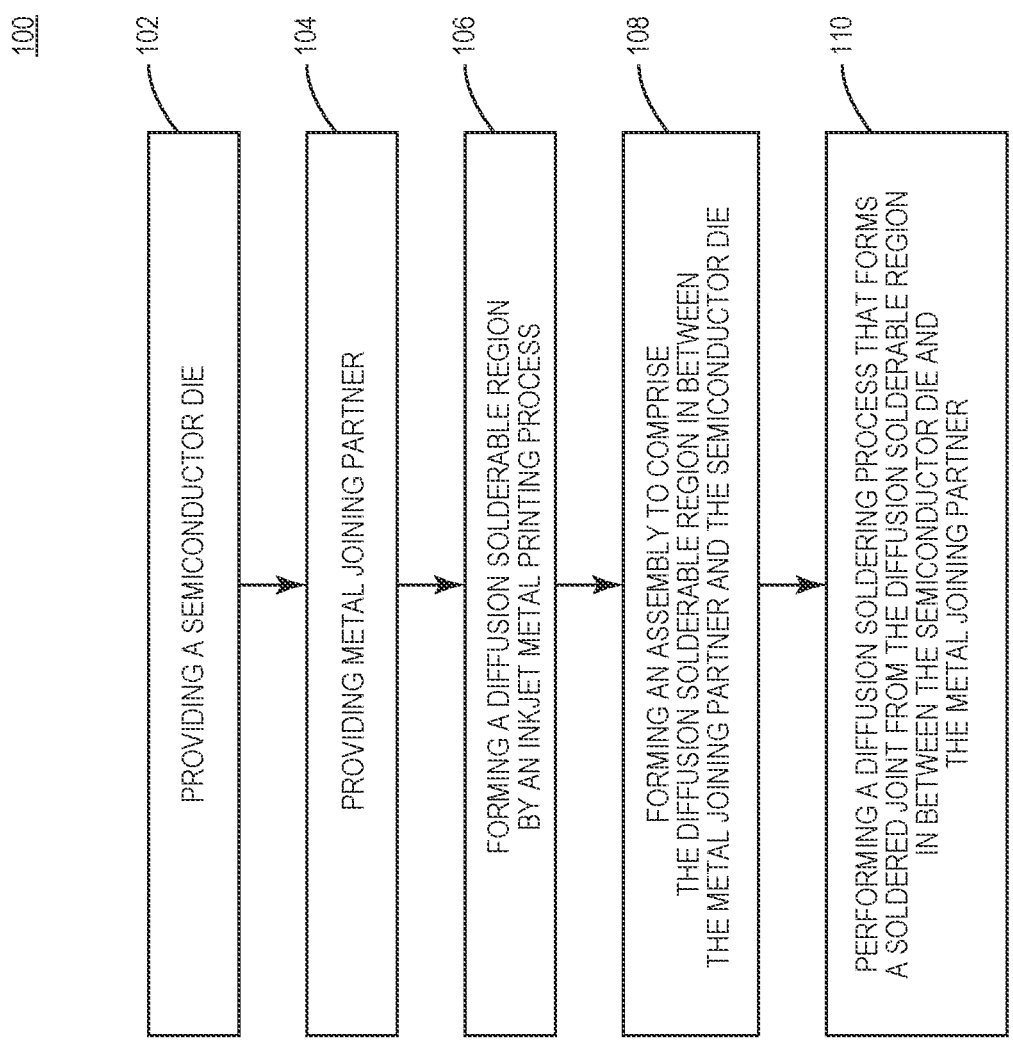
FIG. 1 schematically illustrates a method of producing a semiconductor device that comprises forming a diffusion solderable region by an inkjet metal printing process, according to an embodiment.

Referring to FIG. 1, a method 100 of producing a semiconductor device is shown. A first step 102 of the method 100 comprises providing a semiconductor die. The semiconductor die can have a wide variety of device configurations. These device configurations include different material technologies. For example, the semiconductor die may comprise semiconductor material from group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe).

According to an embodiment, the semiconductor die is configured as a discrete power device. A discrete power device refers to a die with an active device rated to accommodate high load voltages and/or currents, i.e., voltages of at least 100 V (volts), at least 600 V, at least 1200V or more and/or currents of at least 1 A (amperes), at least 10 A, at least 50 A, at least 100 A or more. Examples of discrete power devices include power MOSFETs (metal-oxide semiconductor field-effect transistors), IGBTs (insulated gate bipolar transistors), HEMTs (high electron mobility transistors), power diodes, etc. A semiconductor die that is configured as a discrete power device may be configured as a vertical device that controls a vertical load current flowing between load terminals (e.g., source and drain, collector and emitter, cathode and anode, etc.) that are arranged on opposite facing main and rear surfaces of the semiconductor die. Alternatively, a semiconductor die that is configured as a discrete power device may be configured as a lateral device that controls a lateral load current flowing between load terminals that are arranged on the same main surface of the semiconductor die.

A second step 104 in the method 100 of producing a semiconductor device comprises providing a metal joining partner. The metal joining partner can be anything with a metal attachment surface that can be mechanically and (optionally) electrically connected with the semiconductor die via a soldered connection. The metal joining partner can be an electrically conductive element that is used to form an electrically conductive connection with a terminal of the semiconductor die and/or may be a thermally conductive element that is configured to draw heat away from the semiconductor die. The metal joining partner can comprise and/or be plated with Cu, Ni, Ag, Au, Pd, Pt, NiV, NiP, NiNIP, NiP/Pd, Ni/Au, NiP/Pd/Au, or NiP/Pd/AuAg, for example.

According to an embodiment, the metal joining partner is a metal die attach structure. The term metal die attach structure intends to describe a metal substrate with a die attach surface that is used to accommodate the mounting of a semiconductor die thereon. For example, a metal die attach structure may correspond to a structured metal pad from a circuit carrier, e.g., a DBC (direct bonded copper) substrate, an AMB (active metal brazed) substrate, an IMS (insulated metal substrate), or a PCB (printed circuit board). In another example, the metal die attach structure may corresponds to a die pad that forms part of a lead frame for a molded semiconductor package.

According to an embodiment, the metal joining partner is a metal interconnect element. The term metal interconnect element intends to describe an electrically conductive structure that is adapted to be bonded with a metal bonding surface and form an electrical connection thereto. A metal interconnect element can be bonded to a terminal of a semiconductor die or another metal joining surface, such as a metal pad from a circuit carrier or a lead frame surface. Examples of metal interconnect elements include bond wires, interconnect clips, ribbons, and clip frames.

A third step 106 in method 100 of producing a semiconductor device comprises forming a diffusion solderable region. A diffusion solderable region is a region of pre-solder material with the necessary attributes, e.g., composition, thickness, size, etc., to form a soldered joint by a diffusion soldering process. Examples of solder compositions with the necessary attributes to form a soldered joint by a diffusion soldering process include solder materials comprising Sn, Zn, In, Ga, Bi, Cd, Cu, Ag, Sb, Ni and alloys therof. Particular solder compositions with the necessary attributes to form a soldered joint by a diffusion soldering process include Sn/Ag/Cu, Sn/Ag, Sn/Ag/Sb, Sn/Sb, Sn/Cu, AuSn, NiSn, CuSn, InCu, InNi, ZnSn, to name a few. Examples of solder thicknesses that can form a soldered joint by a diffusion soldering process include thicknesses of less than 200 μm, less than 150 μm, less than 100 μm, etc. These thickness values may be significant lower, e.g., below 50 μm, e.g., no greater than 30 μm, no greater than 25 μm, no greater than 20 μm, etc, which may facilitate the formation of soldered joint with without requiring mechanical pressure to be applied to the joining partners during the diffusion soldering process.

The diffusion solderable region is formed by an inkjet metal printing process. Inkjet metal printing refers to a technique whereby a printer head applies ink directly to a deposition surface, thereby creating a layer or droplet of the ink at a desired location on the deposition surface. The ink used by a metal deposition may comprise a concentration of metal that ultimately form as a solid metal in the printed structure. The metals may be provided in particle form, in particular as nano-particles that are configured to have a lower melting temperature than the counterpart solid metals. Alternatively, the metals may be provided by metal salts that are reduced into metal to form the printed metal structure The ink may comprises a solvent that the metal is suspended within. The solvent may comprise a water or organic solvent such as toluene or ethylene glycol (EG). The ink may also comprise other additives, such as adhesion promoters, binders, etc. The printer head of an inkjet metal printing process is actuated (moved) to form regions of the ink in a desired geometry. Inkjet metal printing processes are capable of depositing metal regions with a high degree of resolution that is not attainable by other types of metal deposition processes, such as screen printing. For example, minimum widths of metal structures formed by inkjet metal printing may be on the order of 20 μm, 15 μm, 10 μm or less.

According to an embodiment, the inkjet metal printing process comprises inkjet metal printing a first metal ink and inkjet metal printing a second metal ink, wherein the first metal ink comprises a first metal, wherein the second metal ink comprises a second metal, and wherein the second metal has a higher melting point than the first metal. The first metal may be a low-melting point metal that liquifies at the joining temperature of the diffusion soldering process, e.g., at temperatures of 400° C. or less. Examples of the first metal include Sn, Zn, In, Ga, Bi, Cd, and alloys thereof. The second metal may be a relatively higher melting point metal that does not necessarily liquify at the joining temperature of the diffusion soldering process. Examples of the second metal include Cu, Ag, Sb, Ni, and alloys thereof. The inkjet metal printing process may comprise printing the first metal ink on the metal joining partner or the semiconductor die. Likewise, the inkjet metal printing process may comprise printing the second metal ink on the metal joining partner or the semiconductor die. Thus, the first metal ink and the second metal ink may each be printed on the metal joining partner, may each be printed on the semiconductor die, or may be printed on two different surfaces, i.e., the first metal ink is formed on the metal joining partner and the second metal ink is formed on the semiconductor die or vice-versa. The inkjet metal printing process may comprise printing the first metal ink and the second metal ink sequentially, i.e., initially forming the first metal ink and subsequently forming the second metal ink or vice-versa. In another embodiment, the inkjet metal printing process comprises using a multi-head printer to print the first metal ink and the second metal ink simultaneously. The inkjet metal printing process may comprise heating the semiconductor die or the metal joining partner before printing metal ink thereon in order to accelerate dissolving of the suspended metal particles into the solvent as the ink is being printed.

According to an embodiment, the inkjet metal printing process further comprises inkjet printing a third ink. The third ink may be a metal ink comprising a third metal that is different from the first metal and the second metal. For example, the third metal may comprise another low-melting point metal, e.g., Sn, Zn, In, Ga, Bi, Cd, and alloys thereof. Alternatively, the third ink may comprise a flux that is used to aid in the solderability/wettability of the material. The third ink may be formed on the metal joining partner or the semiconductor die. Similarly, the inkjet metal printing process may comprise applying additional inks, e.g., a fourth ink, a fifth ink, etc, wherein each of these inks may comprise different metals and/or further additives. Alternatively, third and subsequent inks may be identical to previously deposited inks. For example, a third ink might be identical to a first ink and a fourth ink identical to a second ink, whereby the inks are printed as alternating layers. It shall be understood that the diffusion solderable regions described herein may be formed by inkjet printing any number of additional inks, e.g., a third ink, a fourth ink, a fifth ink, etc., with in the same way as the first metal ink and/or the second metal ink are formed according to the embodiments described herein.

Advantageously, the inkjet metal printing process allows for precise control of volumes and proportions of each metal ink. For example, the diffusion solderable region as completed may comprise a different volume of the first metal ink than the second metal ink. Separately or in combination, the diffusion solderable region as completed may comprise a different molecular weight of the first metal than the second metal. This may be done by inkjet metal printing the first metal ink and the second metal ink separately, wherein the two inks mix into a pre-solder region before the diffusion soldering process are performed. The below embodiments represent just some of the possible ways to obtain a diffusion solderable region with these characteristics.

According to an embodiment, the inkjet printing the first metal ink comprises forming a first layer of the first metal ink and forming a second layer of the second metal ink. In this case, the first layer of the first metal ink and the second layer of the second metal ink are continuous layers metal ink that occupy the area of the diffusion solderable region. These layers intermix before or during the soldering process. The first layer of the first metal ink may have the same area and thickness as the second layer of the second metal ink. Alternatively, the first layer of the first metal ink may have a different size and/or thickness as the second layer of the second metal ink. The first layer of the first metal ink may be printed on the metal joining partner or the semiconductor die. Likewise, the second layer of the first metal ink may be printed on the metal joining partner or the semiconductor die. In an embodiment, the first layer of the first metal ink and the second layer of the second metal ink are each formed on the same surface, i.e., the metal joining partner or the semiconductor die, wherein the second layer of the second metal ink is formed directly on the first layer of the first metal ink. In another embodiment, the first layer of the first metal ink and the second layer of the second metal ink are each formed on different surfaces, i.e., the first layer of the first metal ink is printed on the metal joining partner and the second layer of the second metal ink is printed on the semiconductor die or vice-versa. In that case, the metal inks combine with one another when the metal joining partner and the semiconductor die are assembled together.

According to an embodiment, the inkjet metal printing process comprises forming a first plurality of droplets of the first metal ink on the semiconductor die or the metal joining partner and forming a second plurality of droplets of the second metal ink on the semiconductor die or the metal joining partner, and the diffusion solderable region comprises the first plurality of droplets of the first metal ink interspersed with the second plurality of droplets of the second metal ink. In this case, the inkjet printing comprises forming multiple cells, i.e., the droplets, of each type of metal ink in such a way that these cells are overlaid with one another in the diffusion solderable region. Stated another way, the inkjet printing comprises forming multiple droplets of the first metal ink and the second metal ink on the same surface or within the same area of two surfaces that face one another such that both types of droplets exist in the diffusion solderable region. The droplets of the first metal ink may be formed according to a regular pattern, e.g., a grid-pattern, hexagonal pattern, etc. Likewise, the droplets of the second metal ink may be formed according to a regular pattern, e.g., a grid-pattern, hexagonal pattern, etc. If printed on the same surface, the locus of the droplets of the second metal ink may be shifted from those of the second metal ink such that the two patterns may be overlaid on one another. The patterns of the first metal ink and the second metal ink may be identical to one another. As a result, the diffusion solderable region contains the same volume of the first metal ink as the second metal ink. Alternatively, the patterns of the first metal ink and the second metal ink may differ in some way, e.g., size of the droplets, spacing between droplets, number of droplets, etc.

According to an embodiment, the first plurality of droplets of the first metal ink is interspersed with the second plurality of droplets of the second metal ink such that the diffusion solderable region comprises a different areal density of the droplets of the second metal ink than the droplets of the first metal. That is, droplets of the second metal ink are formed with a greater spacing than the droplets of the first metal ink such that the completed diffusion solderable region contains a few overall number of the droplets of the second metal ink than droplets of the first metal ink. In this way, a desired ratio between the droplets and hence volume ratio of the metal inks may be obtained, e.g., a 3:1 ratio may be obtained by a pattern where 3 droplets of the first metal ink exist for every 1 droplet of the second metal ink, a 4:1 ratio may be obtained by a pattern where 4 droplets of the first metal ink exist for every 1 droplet of the second metal ink, and so forth.

According to an embodiment, the first plurality of droplets of the first metal ink is interspersed with the second plurality of droplets of the second metal ink such that the first plurality of droplets or the second plurality of droplets are non-homogenously distributed throughout diffusion solderable region. That is, the droplets are formed with a greater density within one sub-region of the diffusion solderable region than within another sub-region of the diffusion solderable region. Using the droplets of the second metal ink as an example, a first sub-region of the diffusion solderable region may comprise one amount (e.g., five droplets) and a second sub-region of the diffusion solderable region that is the same size may comprise a different amount (e.g., two droplets). In this way, the droplets of ink can be skewed towards higher concentrations in desired locations of the diffusion solderable region, e.g., near a periphery of the diffusion solderable region.

A fourth step 108 in the method 100 of producing a semiconductor device comprises forming an assembly to comprise the diffusion solderable region in between the metal joining partner and the semiconductor die. In this step, the semiconductor die and the metal joining partner combined with one another to provide the diffusion solderable region in the necessary arrangement for the formation of a soldered joint. For example, forming the assembly may comprise mounting the semiconductor die on a metal joining partner that corresponds to a metal die attach structure, i.e., a die attach process. In an embodiment, the die attach process comprises forming the assembly comprises using a die attach tool, and performing the inkjet metal printing process comprises using a printer head that is incorporated into the die attach tool. In this way, the soldering tooling can be easily integrated into existing tooling at minimal expense. In another example, forming the assembly may comprises placing a metal joining partner that is configured as a metal interconnect element on the semiconductor die.

According to an embodiment, the assembly is formed with multiple diffusion solderable regions, wherein at least one of these diffusion solderable regions is formed by inkjet metal printing. In an example of this, forming the assembly comprises mounting a semiconductor die with a rear surface of the semiconductor die facing a metal die attach structure and forming one or more metal interconnect elements over terminals on a main surface of the semiconductor die. A diffusion solderable region is provided between the rear surface of the semiconductor die and the metal die attach structure and additional diffusion solderable regions are provided between each terminal on the main surface of the semiconductor die and the corresponding metal interconnect, wherein at least one of the diffusion solderable regions is formed by the inkjet metal printing processes described herein. Optionally, some of the diffusion solderable regions may be formed by other types of metal deposition processes, such as screen-printing or spin-coating.

A fifth step 110 in the method 100 of producing a semiconductor device comprises performing a diffusion soldering process that forms a soldered joint from the diffusion solderable region in between the semiconductor die and the metal joining partner. Diffusion soldering refers to a process whereby the solder material is raised to a joining temperature that creates intermetallic phases in the soldered joint, with the primary mechanism for reaction being the diffusion of two different metal atoms to form the intermetallic phases. The intermetallic phases have a higher melting point than the unreacted solder metals such that the soldered joint remains solidified and does not melt unless heated above the joining temperature.

According to an embodiment, the diffusion soldering process comprises arranging the semiconductor die and the metal joining partner(s) with the diffusion solderable region(s) arranged therebetween in in a vacuum oven. An antioxidizing agent such as formic acid may be introduced into the vacuum oven to remove oxidation that may be present on the metal joining surfaces and/or diffusion solderable regions, thereby increasing wettability and enhancing solder reflow. The temperature of the vacuum oven is then increased, e.g., by a heating element under vacuum conditions, above a joining temperature which reflows the diffusion solderable regions. The conditions of this heating step are selected such that the diffusion solderable region(s) melt and react with the metal joining surfaces of the semiconductor die and the metal joining partner(s) to form soldered joint(s) having intermetallic phases contained therein. Each of these intermetallic phases have a melting point above the remaining material of the soldered joints and above the soldering temperature. An intermetallic phase is a chemical compound consisting of two different metals which has a different crystallographic structure as the elements it is composed of. For example, in the case of an Sn based solder material that is provided between Cu based metal surfaces, the soldered joints may include intermetallic phases of CuSn with different crystallographic properties and a higher melting point than alloyed CuSn or metallic Cu and metallic Sn.

According to an embodiment, the diffusion soldering is performed without applying mechanical pressure, e.g., from a movable press. Instead, the thickness and composition of the diffusion solderable regions is selected such that a soldered joint with a high proportion of intermetallic phases is formed by temperature alone. For example, the diffusion solderable regions may have a thickness of below 50 μm, and in embodiments no greater than 30 μm, no greater than 25 μm, no greater than 20 μm, etc. At these thickness levels, high quantities of the intermetallic phases form substantially or completely throughout the thickness of the soldered joint, thereby forming a soldered joint with high tensile strength that is durable with respect to thermal expansion forces caused by high temperature operation.

According to an embodiment, drying steps may optionally be carried out after some or all of the inkjet printing steps. For example, after printing one inkjet layer, it may be advantageous to allow that layer to completely dry or partially dry before printing another layer. In another example, drying could take place after all inkjet layers have been printed, but before diffusion soldering takes place. Drying could entail simply pausing to allow the printed layer to dry, or additional steps could be taken to facilitate drying, such as heating or directing air toward the printed layer, in order to expedite the drying process.

Figure 2:
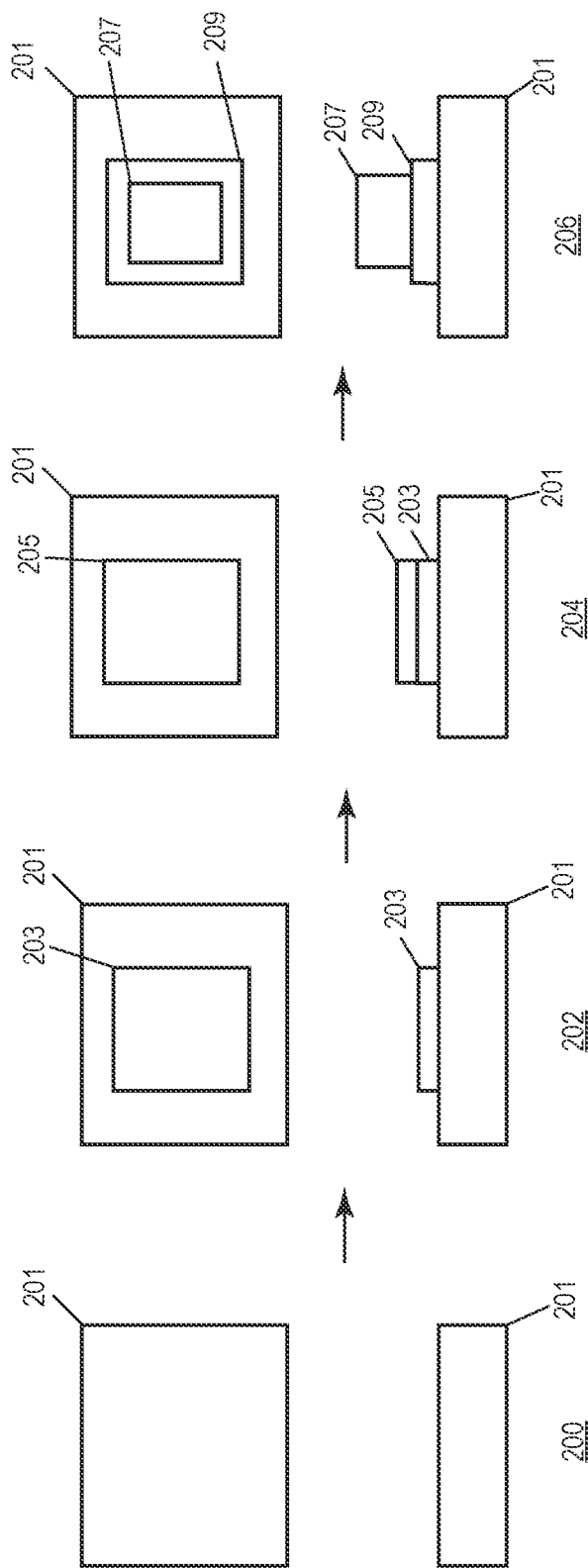
FIG. 2 illustrates a method of producing a semiconductor device that comprises using an inkjet metal printing process to form a diffusion solderable region by forming layers of metal ink, according to an embodiment.

Referring to FIG. 2, a method is shown wherein a diffusion solderable region is formed by inkjet metal printing layers of metal ink, according to an embodiment. The lower figures for each method step represent a side view of the assembly and the upper figures for each method step represent a corresponding plan-view of the assembly. In a first step 200, a metal die attach structure 201 is provided. In a second step 202, a first layer 203 of the first metal ink is formed on the metal die attach structure 201 by inkjet metal printing. In a third step 204, a second layer 205 of the second metal ink is formed on the metal die attach structure 201 on top of the first layer 203 of the first metal ink by inkjet metal printing. In a fourth step 206, a semiconductor die 207 is placed on a diffusion solderable region corresponding to the first layer 203 of the first metal ink and the second layer 205 of the second metal ink. Subsequently, a diffusion soldering process is performed to form a soldered joint 209 from the diffusion solderable region in between the semiconductor die 207 and the metal die attach structure 201.

Referring to FIG. 3, two alternate configurations of a diffusion solderable region are shown. In the embodiment of FIG. 3A, the diffusion solderable region is formed to comprise a concave surface that faces away from the metal die attach structure 201. In the embodiment of FIG. 3B, the diffusion solderable region is formed to comprise a convex surface that faces away from the metal die attach structure 201. Either one of these geometries can be used to compensate for warpages that may occur in the assembly, e.g., from differences in CTE (coefficient of thermal expansion) of the materials.

Figure 4:
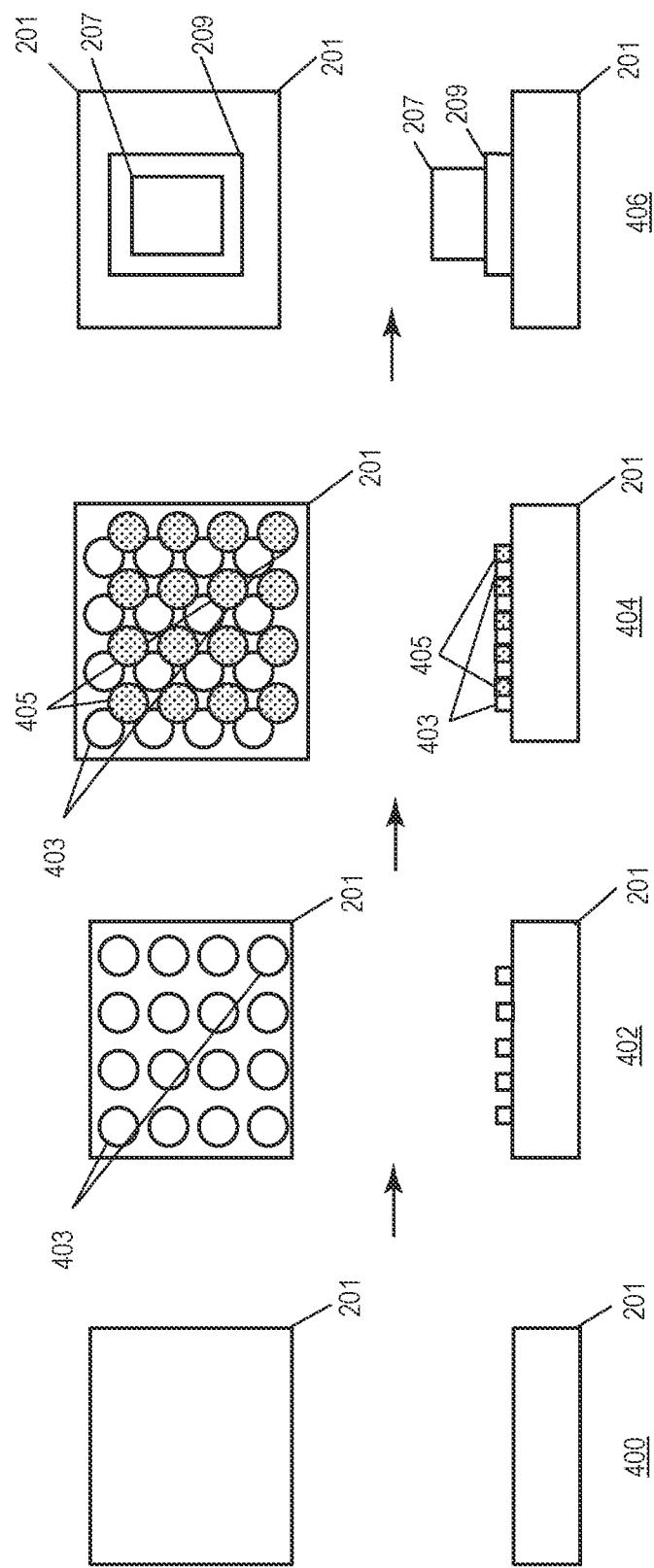
FIG. 4 illustrates a method of producing a semiconductor device that comprises using an inkjet metal printing process to form a diffusion solderable region by forming droplets of metal ink, according to an embodiment.

Referring to FIG. 4, a method is shown wherein a diffusion solderable region is formed by inkjet metal printing droplets of metal ink, according to an embodiment. The lower figures for each method step represent a side view of the assembly and the upper figures for each method step represent a corresponding plan-view of the assembly. In a first step 400, a metal die attach structure 201 is provided. In a second step 402, a first plurality 403 of droplets of the first metal ink is formed on the metal die attach structure 201 by inkjet metal printing. In this case, the first plurality 403 of droplets is formed in a grid pattern wherein each of the droplets is regularly spaced apart from one another in a vertical direction and in a horizontal direction. In a third step 404, a second plurality 405 of droplets of the second metal ink is formed on metal die attach structure 201 by inkjet metal printing. In this case, second plurality 405 of droplets of the second metal ink is formed in a grid pattern similar to that of the first plurality 403, except that the locus of the droplets from the second plurality 405 is offset from the locus of the droplets from the first plurality 403, thereby creating interspersion of the two metal inks. In a fourth step 406, a semiconductor die 207 is placed on a diffusion solderable region corresponding to the first plurality 403 of droplets of the first metal ink and the second plurality 405 of droplets of the second metal ink. Subsequently, a diffusion soldering process is performed to form a soldered joint 209 from the diffusion solderable region in between the semiconductor die 207 and the metal joining partner.

Referring to FIG. 5, two alternate configurations of the interspersions of the first metal ink and the second metal ink are shown. In the example of FIG. 5A, the first plurality 403 of droplets of the first metal ink is interspersed with the second plurality 405 of droplets of the second metal ink such that the diffusion solderable region comprises a different areal density of the droplets of the second metal ink than the droplets of the first metal ink. More particularly, the second plurality 405 of droplets is formed in a grid pattern with a greater spacing between the droplets as in the first plurality 403 of droplets. As a result, there is a greater density of the droplets of the first metal ink than the second metal ink within the diffusion solderable region. In the example of FIG. 4B, the first plurality 403 of droplets of the first metal ink is interspersed with the second plurality 405 of droplets of the second metal ink such that the droplets of the second metal ink are non-homogenously distributed throughout diffusion solderable region. In particular, the second plurality 405 of droplets is formed in a ring-shaped pattern near the periphery of the diffusion solderable region, with a central region of the mounting area being devoid of droplets of the second metal ink. As a result, there is a concentration of the second metal ink near the near the periphery. This concept can be used to create a concertation of the intermetallic phases at desired locations within the fully formed soldered joint 209.

Figure 6:
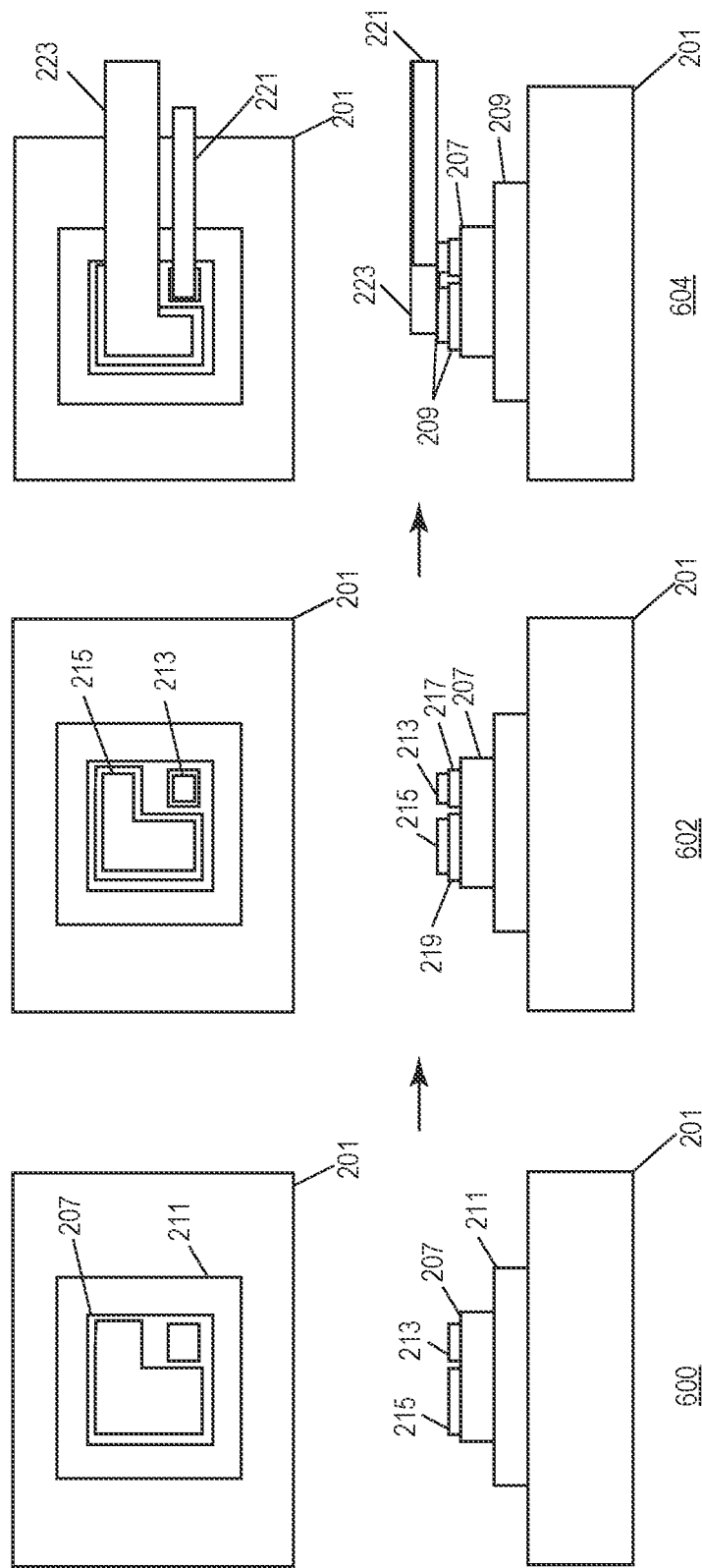
FIG. 6 illustrates a method of producing a semiconductor device that comprises multiple soldered joints at opposite sides of a semiconductor die, wherein at least one of the soldered joints is formed by an inkjet metal printing process, according to an embodiment.

Referring to FIG. 6, a method is shown wherein multiple diffusion solderable regions are formed in an assembly, with at least one of these diffusion solderable regions being formed by inkjet metal printing layers of metal ink, according to an embodiment. The lower figures for each method step represent a side view of the assembly and the upper figures for each method step represent a corresponding plan-view of the assembly. In a first step 600, an assembly is provided that comprises a semiconductor die 207 mounted on a metal die attach structure 201 with a first diffusion solderable region 211 arranged between a rear side of the semiconductor die 207 and the metal die attach structure 201. In a second step 602, a second diffusion solderable region 213 and a third diffusion solderable region 215 is provided on a main side of the semiconductor die 207 that faces away from the metal die attach structure 201. The second diffusion solderable region 213 is formed on a first terminal 217 of the semiconductor die 207 and the third diffusion solderable region 215 is formed on a second terminal 219 of the of the semiconductor die 207. According to an embodiment, the semiconductor die 207 is a power transistor die, the first terminal 217 is a gate terminal and the second terminal 219 is a load terminal, e.g., source terminal, emitter terminal, etc. In a third step 604, a second metal interconnect 221 element is provided over the second diffusion solderable region 213 and a third metal interconnect element 223 is provided over the third diffusion solderable region 215. Subsequently, a diffusion soldering process is performed to form a soldered joint 209 from each of the first diffusion solderable region 211, the second diffusion solderable region 213, and the third diffusion solderable region 215.

In the embodiment of FIG. 5, any one of the first diffusion solderable region 211, the second diffusion solderable region 213, and the third diffusion solderable region 215 may be formed by inkjet metal printing. In an embodiment, the first diffusion solderable region 211 is formed by a screen-printing process. In this case, the size and thickness of the first diffusion solderable region 211 may be amenable to a screen-printing technique. Meanwhile, the second diffusion solderable region 213, and the third diffusion solderable region 215 are formed by inkjet metal printing. Inkjet metal printing may be preferable with respect to these regions because of the precision required to form the solder material on the relatively small and/or closely spaced features of the semiconductor die 207.

Although the present disclosure is not so limited, the following numbered examples demonstrate one or more aspects of the disclosure.

Example 1. A method of producing a semiconductor device, the method comprising: providing a semiconductor die; providing a metal joining partner; forming a diffusion solderable region by an inkjet metal printing process; forming an assembly to comprise the diffusion solderable region in between the metal joining partner and the semiconductor die; and performing a diffusion soldering process that forms a soldered joint from the diffusion solderable region in between the semiconductor die and the metal joining partner.

Example 2. The method of example 1, wherein performing the inkjet metal printing process comprises: inkjet metal printing a first metal ink on the metal joining partner or the semiconductor die; and inkjet metal printing a second metal ink on the metal joining partner or the semiconductor die, wherein the first metal ink comprises a first metal, wherein the second metal ink comprises a second metal, wherein the second metal has a higher melting point than the first metal.

Example 3. The method of example 2, wherein the first metal is any one of the following: Sn, Zn, In, Ga, Bi, Cd, and wherein the second metal is any one of the following: Cu, Ag, Sb, Ni.

Example 4. The method of example 2, wherein performing the diffusion soldering process comprises raising a temperature of the assembly to a joining temperature whereby intermetallic phases form in the soldered joint.

Example 5. The method of example 2, wherein inkjet metal printing a first metal ink comprises forming a first layer of the first metal ink on the metal joining partner or the semiconductor die, and wherein inkjet metal printing the second metal ink comprises forming a second layer of the second metal ink on the metal joining partner or the semiconductor die.

Example 6. The method of example 5, wherein the first layer of the first metal ink is formed on the metal joining partner, and wherein the second layer of the second metal ink is formed on the semiconductor die.

Example 7. The method of example 2, wherein inkjet metal printing a first metal ink comprises forming a first plurality of droplets of the first metal ink on the semiconductor die or the metal joining partner, and wherein inkjet metal printing the second metal ink comprises forming a second plurality of droplets of the second metal ink on the semiconductor die or the metal joining partner, and wherein the diffusion solderable region comprises the first plurality of droplets of the first metal ink interspersed with the second plurality of droplets of the second metal ink.

Example 8. The method of example 7, wherein the first plurality of droplets of the first metal ink is interspersed with the second plurality of droplets of the second metal ink such that the diffusion solderable region comprises a different areal density of the droplets of the second metal ink than the droplets of the first metal ink.

Example 9. The method of example 7, wherein the first plurality of droplets of the first metal ink is interspersed with the second plurality of droplets of the second metal ink such that the first plurality of droplets or the second plurality of droplets are non-homogenously distributed throughout diffusion solderable region.

Example 10. The method of example 2, wherein performing the inkjet metal printing process further comprises: inkjet printing a third ink on the metal joining partner or the semiconductor die, wherein the third ink comprises a flux and/or a third metal different from the first metal and the second metal.

Example 11. The method of example 2, wherein performing the inkjet metal printing process comprises using a multi-head printer to print the first metal ink and the second metal ink simultaneously.

Example 12. The method of example 2, forming the assembly comprises using a die attach tool, and wherein performing the inkjet metal printing process comprises using a printer head that is incorporated into the die attach tool.

Example 13. The method of example 2, wherein the metal joining partner is a metal die attach structure, and wherein the soldered joint forms a connection between the metal die attach structure and a rear side terminal of the semiconductor die.

Example 14. The method of example 12, wherein the diffusion solderable region is formed to comprise a concave or convex surface that faces away from the metal die attach structure.

Example 15. The method of example 2, wherein the metal joining partner is a metal interconnect element, and wherein the soldered joint forms a connection between the metal interconnect element and a main side terminal of the semiconductor die.

Example 16. A method of producing a semiconductor device, the method comprising: providing a semiconductor die; providing a metal die attach structure; providing a first metal interconnect element; forming a first diffusion solderable region and a second diffusion solderable region; forming an assembly to comprise the first diffusion solderable region in between the metal die attach structure and the semiconductor die and to comprise the second diffusion solderable region in between the semiconductor die and the first metal interconnect element; and performing a diffusion soldering process that forms a first soldered joint from the first diffusion solderable region in between the semiconductor die and the metal joining partner and a second soldered joint from the second diffusion solderable region in between the semiconductor die and the first metal interconnect element, wherein at least one of the first diffusion solderable region and the second diffusion solderable region is formed by an inkjet metal printing process.

Example 17. The method of example 16, wherein the second diffusion solderable region is formed by the inkjet metal printing process.

Example 18. The method of example 17, wherein the first diffusion solderable region is formed by screen-printing.

Example 19. The method of example 16, wherein the semiconductor die is configured as a power transistor die.

Example 20. The method of example 16, wherein the semiconductor die comprises a first terminal and a second terminal each being disposed on a main surface of the semiconductor die, wherein the first terminal is a gate terminal, wherein the second terminal is a load terminal, wherein the second diffusion solderable region is formed on the first terminal, wherein the method further comprises providing a second metal interconnect element, forming a third diffusion solderable region on the second terminal, forming the assembly to comprise the third diffusion solderable region in between the semiconductor die and the second metal interconnect element, and performing the diffusion soldering process to form a third soldered joint from the third diffusion solderable region, and wherein the second diffusion solderable region and the third diffusion solderable region are each formed by the inkjet metal printing process.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of producing a semiconductor device, the method comprising:
   providing a semiconductor die;
   providing a metal die attach structure;
   providing a first metal interconnect element;
   forming a first diffusion solderable region and a second diffusion solderable region;
   forming an assembly to comprise the first diffusion solderable region in between the metal die attach structure and the semiconductor die and to comprise the second diffusion solderable region in between the semiconductor die and the first metal interconnect element; and
   performing a diffusion soldering process that forms a first soldered joint from the first diffusion solderable region in between the semiconductor die and the metal die attach structure and a second soldered joint from the second diffusion solderable region in between the semiconductor die and the first metal interconnect element;
wherein at least one of the first diffusion solderable region and the second diffusion solderable region is formed by an inkjet metal printing process.

2. The method of claim 1, wherein the second diffusion solderable region is formed by the inkjet metal printing process.

3. The method of claim 2, wherein the first diffusion solderable region is formed by screen-printing.

4. The method of claim 1, wherein the semiconductor die is configured as a power transistor die.

5. The method of claim 1, wherein the semiconductor die comprises a first terminal and a second terminal each being disposed on a main surface of the semiconductor die, wherein the first terminal is a gate terminal, wherein the second terminal is a load terminal, wherein the second diffusion solderable region is formed on the first terminal, wherein the method further comprises providing a second metal interconnect element, forming a third diffusion solderable region on the second terminal, forming the assembly to comprise the third diffusion solderable region in between the semiconductor die and the second metal interconnect element, and performing the diffusion soldering process to form a third soldered joint from the third diffusion solderable region, and wherein the second diffusion solderable region and the third diffusion solderable region are each formed by the inkjet metal printing process.

\* \* \* \* \*